United States Patent [19]

Lapham et al.

[11] Patent Number: 4,917,122
[45] Date of Patent: Apr. 17, 1990

[54] COMPOSITIONS FOR USE IN THE PRODUCTION OF INTEGRATED CIRCUITS AND METHOD FOR ITS PREPARATION AND USE

[75] Inventors: David J. Lapham, Widnes; Geoffrey Hitchmough, Runcorn, both of United Kingdom

[73] Assignee: Micro-Image Technology Limited, London, England

[21] Appl. No.: 287,520

[22] Filed: Dec. 19, 1988

Related U.S. Application Data

[63] Continuation of Ser. No. 75,137, Jul. 20, 1987, abandoned.

[30] Foreign Application Priority Data

Aug. 9, 1986 [GB] United Kingdom ............... 8619476
Dec. 18, 1986 [GB] United Kingdom ............... 8630215

[51] Int. Cl.$^4$ .............................................. B08B 3/08
[52] U.S. Cl. ........................................ 134/3; 156/651; 156/659.1; 156/668; 252/79.2
[58] Field of Search ..................... 252/79.2; 134/3; 156/651, 659.1, 668

[56] References Cited

U.S. PATENT DOCUMENTS 3,214,454 10/1965 Blaser ................................ 252/79.2
3,383,114 5/1968 Carnine ............................. 252/79.2
3,900,337 8/1975 Beck et al. ........................ 252/79.2
4,144,119 3/1979 Dutkewych et al. ............... 252/79.2

FOREIGN PATENT DOCUMENTS 1427482 3/1976 Fed. Rep. of Germany.
2231110 3/1974 France.

OTHER PUBLICATIONS

Journal of Elec. Society. vol. 127, #2, 2/80, pp. 386–392.
Tech B Lieferung s, System-num. 9, pp. 798–803.
D. J. Elliott'S Int. Cir. Fabrication Tech., 1982, pp. 302–304.
IBM Tech. Disc. Bulletin, vol. 18, No. 9, 2/76.
IBM Technical Disc. Bulletin, vol. 18, No. 10, 3/76.
IBM Technical Disc. Bulletin, vol. 24, #11A, 4/82.
CA: 104:231323E (1986).
CA:105: 197756S (1986).
Kirk-Othmer, Encyclopedia of Chem. Technology, vol. 13, pp. 14 (1981).
Kaplan et al., IBM Technical Dislosure Bull., vol. 18(9), Feb. 1976, pp. 2861–2862.
Chemical Abstract (CA): 93:13751r (1980).
CA: 93:54757r (1980).
CA: 93:101894v (1980).
CA: 95:68633a (1981).
CA: 95:176413 (1981).
CA: 104:11053m (1986).
CA: 104:116780h (1986).
CA: 104:116795h (1986).

*Primary Examiner*—Asok Pal
*Attorney, Agent, or Firm*—Kane, Dalsimer, Sullivan, Kurucz, Levy, Eisele and Richard

[57] ABSTRACT

A photoresist stripping solution is prepared by adding hydrogen peroxide to concentrated sulphuric acid under controlled temperature conditions, preferably at below 20° C. The concentration of the sulphuric acid in the solution is preferably maintained at at least 80% wt to maximize the concentration of the active stripping species permonosulphuric acid. Stripping solutions having extended storage life have a content of soluble tim compound preferably sodium stannate and preferalby also a phosphonate sequestrant which shows a synergism with the tin compound. Such extended life solutions also preferably have a low content of transition metals and of particles. The stripping solution may be utilized at ambient temperature.

11 Claims, No Drawings

COMPOSITIONS FOR USE IN THE PRODUCTION OF INTEGRATED CIRCUITS AND METHOD FOR ITS PREPARATION AND USE

This application is a continuation of U.S. application Ser. No. 07/075,137, filed July 20, 1987, now abandoned.

BACKGROUND OF THE INVENTION

1. Field of the Invention

This invention relates to a composition for use in the production of integrated circuits, more particularly to a photoresist stripping solution and to a method for its production.

2. Brief Description of the Prior Art

Integrated circuits are produced by coating a semiconductor substrate surface, e.g. a silicon wafer, possibly after a layer of conductive metal such as aluminum has been applied to the surface, with a layer of photoresist material, applying to the photoresist surface a pattern corresponding in either the positive or negative sense to the desired circuit element, activating the printed photoresist layer by exposure to suitable activating radiation, such as light or X-rays, to make the printed and unprinted areas of it differentially soluble in a developing solution and treating the activated photoresist layer with the developing solution to remove the soluble areas of the photoresist layer either to expose the substrate surface, for the application thereto of the desired circuit element which may be by deposition of a conductive metal or metal oxide or by ion implantation with, for example, boron ions into the body of the substrate, or to expose a pre-applied conductive layer which may be etched to remove all but the desired circuit element.

The photoresist layer may be what is known as "positive", that is the activated portions become soluble, or "negative" that is the activated portions become insoluble, on development. A "positive" photoresist may comprise a suitable resin such as a phenol-aldehyde resin, e.g. a phenol-formaldehyde resin, an acrylate or methacrylate resin, a polyvinyl cinnamate resin, or other cross-linkable resin while a "negative" photoresist material may comprise, for example, a polyisoprene material. The photoresist layer is commonly baked at elevated temperature subsequent to development to ensure that cross-linking takes place.

After the application of a desired integrated circuit element to the substrate, the residue of the photoresist layer must be removed to a very high standard of efficiency in preparation for the application of a further integrated circuit element. Photoresist stripping solutions have been developed for this purpose on the basis of phenolic compounds, but such solutions present environmental and disposal problems.

It has been proposed in Japanese Patent Publication No. 50-101107 to strip photoresists by immersing a semiconductor wafer bearing the photoresist in concentrated sulphuric acid to which hydrogen peroxide has been added to cause an exothermic reaction resulting in the decomposition of the hydrogen peroxide with the evolution of nascent oxygen. The wafer is introduced into the hot solution during or immediately after the exothermic reaction the nascent oxygen being postulated to react with the components of the photoresist film so as to degrade it to form carbon dioxide and water. When the temperature of the solution has decreased to 30° C., sulphur trioxide is added to replenish the sulphuric acid and a further quantity of hydrogen peroxide is added, whereupon the solution temperature is raised under the influence of the same exothermic reaction and further nascent oxygen is evolved enabling the stripping process to be resumed. The process may be continued over a number of cycles thereby enabling the extended use of the original stripping solution. The process described in the aforementioned Japanese patent publication would result in undue attack on aluminum coatings present on a wafer.

U.S. Pat. No. 3,900,337 discloses the stripping of photoresists by the use of a mixture of hydrogen peroxide and concentrated sulphuric acid made up by adding the sulphuric acid to the hydrogen peroxide. This causes the temperature of the mixture to increase to 70° C. After subsequent cooling to room temperature the resulting solution may be used. This solution has a lifetime of 3 weeks but only if reagent grade sulphuric acid and hydrogen peroxide are used. The aforementioned U.S. Patent Specification makes a point of the order of mixing of the sulphuric acid and the hydrogen peroxide so as to attain the generation of heat. As a consequence of this a proportion of the hydrogen peroxide will have decomposed to produce nascent oxygen which is lost and it has been found that a stripping solution produced according to this procedure, if shaken, will release a further quantity of oxygen resulting in bubbling and effervescence. The quantity of water present in the sulphuric acid utilised in the above procedure is critical to the effectiveness of the solution for which reason the concentration of the sulphuric acid must be at least 95% wt. and even at that limiting concentration 85% by weight hydrogen peroxide must be used.

The present invention relates to a new or improved process for the production of photoresist stripping solutions. Besides extending the range of materials usable for the production of such compositions, the present invention also enables new and more stable photoresist stripping compositions to be produced and such compositions are provided "per se" thereby.

SUMMARY OF THE INVENTION

According to one aspect thereof the present invention provides a process for the production of a photoresist stripping solution in which the active stripping constituent consists essentially of permonosulphuric acid comprising introducing an aqueous solution of hydrogen peroxide into a quantity of concentrated sulphuric acid while controlling the temperature, if necessary by cooling, to avoid the evolution of nascent oxygen, at a temperature preferably below 20° C. particularly preferably below 15° C. A stripping solution so produced may be utilised effectively at relatively low stripping temperatures and provide the basis of solutions having an extended storage life as hereafter described.

DETAILED DESCRIPTION OF THE PREFERRED EMBODIMENTS OF THE INVENTION

Hydrogen peroxide is not normally commercially available at concentrations substantially above about 85% by weight in water, so-called "high test" hydrogen peroxide. While high test hydrogen peroxide may very suitably be utilised as an ingredient of the stripping solution of the present invention this is not essential and hydrogen peroxide having the full range of concentrations disclosed in U.S. Pat. No. 3,900,337 may be used.

Preferably the hydrogen peroxide, as introduced has a concentration of at least 50%, and particularly preferably of at least 60% by weight.

The sulphuric acid utilised as an ingredient of the stripping solutions of the present invention is preferably of at least 85%, and particularly preferably of at least 95% by weight concentration. Sulphuric acid having a concentration of at least 98% by weight is found to be particularly suitable.

The quantity of hydrogen peroxide relative to that of sulphuric acid in the stripping solutions is preferably such as to produce from 0.2% to 10%, particularly preferably from 2% to 10% by weight of $H_2SO_5$ according to the equation $$H_2SO_4 + H_2O_2 \rightleftharpoons H_2SO_5 + H_2O$$

The concentration of sulphuric acid in the stripping solution is an important feature in the practice of this invention in that, if the said concentration is below 75% by weight only a low concentration of permonosulphuric acid can be achieved or maintained. The presence of higher concentrations of sulphuric acid in the stripping solutions enables higher concentrations of permonosulphuric acid to be achieved. In a test an aqueous solution contained 75% by weight of $H_2SO_4$ and 1.43% wt of $H_2O_2$ and 4.22% wt of $H_2SO_5$. Further solutions were produced using the same recipe each modified only in that the concentration of the sulphuric acid was increased to 80%, 85%, 90% and 95% by weight. The % by weight of $H_2SO_5$ in each of these solutions is set out in the following Table I.

TABLE 1

| % wt $H_2SO_4$ | % wt $H_2SO_5$ | % wt Residual $H_2O_2$ |
|---|---|---|
| 75 | 4.22 | 1.43 |
| 80 | 5.46 | 0.89 |
| 85 | 6.88 | 0.31 |
| 90 | 6.66 | 0.21 |
| 95 | 6.75 | 0.10 |

Preferably therefore the concentration of sulphuric acid in the stripping solutions is at least or greater than 75% by weight, preferably greater than 80% by weight and very suitably greater than 85% by weight and that the concentrations and ratios of the ingredients, be controlled accordingly.

Preferably the stripping solution contains less than 10% by weight, particularly preferably not more than 6% by weight, of water in the stripping solution (whether added as part of aqueous sulphuric acid or as part of the hydrogen peroxide or generated by the formation of $H_2SO_5$). If 10% or more by weight of water is present in uncombined form, the metallisation layers of the wafer surface may become badly damaged in the course of the stripping operation, particularly when such metallisation comprises aluminium.

It is particularly preferred, when stripping solutions containing the lower water contents, e.g. below 4.5% particularly below 4% by weight, are desired to include sulphur trioxide in the stripping solutions of the present invention to react with at least a proportion of the water present. Alternatively it is preferred to include sulphur trioxide in the stripping solutions if it is desired to use sulphuric acid having a concentration below 97.5% and/or hydrogen peroxide having a concentration below 85% by weight but nevertheless produce a low water content stripping solution. This avoids the disadvantages of the rigid restraints on reactant concentrations disclosed in U.S. Pat. No. 3,900,337 mentioned above. The use of sulphur trioxide according to the invention, as above described, results in new compositions of matter comprising stripping solutions essentially consisting of sulphuric acid and permonosulphuric acid, such solutions containing less than 10% by weight of water, preferably no more than 6% by weight of water and, very suitably, for example, at least 0.05% by weight of water added as such and generated in situ, or even containing substantially no water.

The sulphur trioxide is preferably introduced into the stripping solutions of this invention in the form of oleum. There is a wide range of oleum of differing sulphur trioxide concentrations available ranging from as little as 0.5% wt to 30% wt or over. The oleum may be used in partial replacement for the appropriate quantity of sulphuric acid in the stripping solution or even in total replacement therefor, within the overall guidelines as to the maximum quantity of water which should be left in the solution in uncombined form. Where a very low water concentration stripping solution is required, it may be convenient to form the solution from hydrogen peroxide of at least 80% by weight concentration and 25% to 35% by weight concentration oleum.

Very desirably, a preferred stripper solution of the present invention is made by adding 1 volume of HTP (85% by weight hydrogen peroxide in water) to 40 volumes of 98% by weight sulphuric acid, the temperature being held below 15° C. during addition. This gives a product containing approximately 4.6% by weight of permonosulphuric acid and approximately 2.2% by weight of water. It is a simple matter to calculate the appropriate ratios for different concentrations of hydrogen peroxide and sulphuric acid (or oleum) in order to give the required water content and a content of permonosulphuric acid which is in the preferred range described above.

The present invention also provides sulphuric acid/hydrogen peroxide photoresist stripping solutions having an extended storage life. Such solutions are new compositions of matter essentially consisting of sulphuric acid, hydrogen peroxide and permonosulphuric acid and optionally, depending on the quantity of sulphur trioxide, if any, used in the production of the solution, water the concentration of the sulphuric acid being preferably greater than 75% by weight and the solutions being characterised by a content of a soluble tin compound. Preferably the soluble tin compound is present in the solution in at least 0.01 parts for example, very suitably at least 0.2 parts per million by weight calculated as tin. It is unnecessary that the tin compound be present in more than 1 part per million on the same basis since even quantities of 0.02 parts per million and below can give extended stability in storage. Very suitably the tin compound is a stannate for example an alkali metal stannate which may very suitably be sodium stannate. Alternatively the tin compound may be stannous oxide or any other compound which forms a hydrous tin oxide 'in situ'. The soluble tin compound may be added as such to the stripping solution or as a constituent of the hydrogen peroxide solution in which last event it may be present in the hydrogen peroxide, preferably, in from 0.5 to 4 parts per million by weight.

The stripping solutions of the present invention preferably also contain a sequestrant. Where an aluminium metallisation layer is present on the wafer or other substrate to be treated the sequestering agent and indeed any other ingredient of the stripping solution preferably contains no more than 0.1 parts per million by weight of chlorine to avoid deterioration of said layer.

The sequestrant must be suitable for use in the very aggressive environment of the stripping solution which can cause charring of some commonly used sequestrants for example hydroxy benzoic acid esters. A suitable range of sequestering agents are organic compounds containing acidic pentavalent phosphorus-containing groupings, for example, preferably, phosphonic acid($HPO.(OH)_2$) groupings and preferably containing from 2 to 5 such groupings. The hydroxyls of the phosphonic acid groupings may optionally be substituted by other active hydrogen containing groupings for example ammonium.

Preferably the two or more acid pentavalent phosphorus-containing groupings are linked via alkylene or substituted alkylene groupings, which groupings preferably contain from 1 to 4 carbon atoms and may preferably be methylene, dimethylene, or ethylidene, for example hydroxy ethylidene

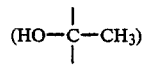

groupings.

In the case of compounds containing 3 or more acidic pentavalent phosphorus-containing groupings such compounds preferably comprise a linking tertiary nitrogen atom or atoms attached to said alkylene groups.

Examples of such compounds are the range of sequestrants available under the Trade Name Dequest, for example:
Aminotri(methylene phosphonic acid)—(Dequest 2000)
Ammonium salt of ethylenediamine tetra (methylene phosphonic acid)—(Dequest 2042)
Ammonium salt of hexamethylenediamine tetra(methylene phosphonic acid)—(Dequest 2052)
Diethylene triamine penta(methylene phosphonic acid)—(Dequest 2060)
but preferably
1-hydroxyethylidene 1,1-Diphosphonic acid (Dequest 20100.

The concentration of the sequestrant is preferably from 0.01% to 1.0% by weight particularly preferably from 0.1% to 0.4% by weight of the solution greater quantities being unnecessary.

It is found unexpectedly that the presence of a sequestrant as above taught further improves the storage stability of stripping solutions according to the invention and already containing a tin compound although in the absence of the tin compound a decrease in stability is observed. This is illustrated by the following Tests.

A stripping solution (A) was prepared containing 40 volumes of 95% by weight aqueous $H_2SO_4$, 1 volume of 85% by weight of aqueous $H_2O_2$, 4 parts by million of soluble tin by weight of the hydrogen peroxide and 0.2% by weight of Dequest 2010 sequestrant by weight of the total solution. Other stripping solutions B, C and D were prepared to the same recipe varied only in omitting the Dequest (B), the tin (C) and both the tin and the Dequest (D). The active oxygen content of the solutions expressed as $H_2O_2$ was determined initially and after a storage period of 5 hours at 70° C. The loss of active oxygen during the period, so expressed, was calculated as a % of the initial value and is set out in the following Table 2.

TABLE 2

| Solution | Loss % |
|---|---|
| A | 14.15 |
| B | 14.81 |
| C | 22.14 |
| D | 19.28 |

Extended storage life solutions according to the present invention are preferably further characterised by a low concentration of transition metals, calculated as the elements and of a low concentration of particles according to the preferred particularly preferred and optional limits set out in the following Tables 3 and 4 hereafter.

TABLE 3

| | Maximum concentration - parts per billion ($10^{12}$) by weight | | |
|---|---|---|---|
| Metal | Preferred | Particularly preferred | Optimal |
| Cobalt | 100 | 50 | 10 |
| Chromium | 100 | 50 | 10 |
| Copper | 100 | 50 | 10 |
| Iron | 1000 | 500 | 100 |
| Manganese | 100 | 50 | 10 |
| Nickel | 100 | 50 | 10 |
| Zinc | 500 | 250 | 50 |

TABLE 4

| | Particle concentration maxima (number ≦ given size in 10 ml | |
|---|---|---|
| Particle size Microns | Preferred | Particulary preferred |
| 0.5 | 2000 | 1500 |
| 1.0 | 500 | 300 |
| 2.0 | 120 | 70 |
| 5.0 | 16 | 10 |
| 10.0 | 4 | 2.5 |
| 15.0 | 1.7 | 1 |

The metal and particle concentrations referred to may be attained by the use of electronic grade chemicals having the required characteristics as ingredients of the compositions.

It may also be preferred to add a suitable surfactant, for example or a fluoro-alcohol ethoxylate, to the stripping solution. The surfactant increases the wetting and therefore the attack on the resist. Effectively the attack on the aluminium layer is therefore reduced.

The photoresist stripping solutions of the present invention may be utilised by immersing therein a photoresist bearing substrate for a suitable time, which may for example for about 10 seconds to about 15 minutes, removing the substrate and rinsing the substrate in 18 megaohm water. It is a feature of this invention that, to avoid attack on desired metallisation on the substrate, the temperature of treatment is preferably maintained at below 50° C., particularly preferably below 40° C. and optionally at from 10° C. to below 30° C.

The invention will now be illustrated by reference to the following photoresist stripping Tests.

The Tests were carried out by dipping silicon wafers coated with 12,000 Angstroms of aluminium and 10,000 Angstroms of patterned positive photoresist baked at 160° C. into a bath of stripper. Only a single bath was used, unlike the twin bath of U.S. Pat. No. 3,900,337.

The various stripping solutions used in the various Examples were as follows:

The stripping solutions used were produced by mixing 98% wt sulphuric acid and aqueous hydrogen peroxide of appropriate concentration to give the permonosulphuric acid and water contents given below. Strippers A, B, C, D and J were produced by introducing the hydrogen peroxide into a quantity of the sulphuric acid while controlling the temperature of the solution below 15° C. and are in accordance with the present invention. Strippers E, F, and G were produced by the procedure of U.S. Pat. No. 3900337, that is, by the addition of the sulphuric acid to the hydrogen peroxide solution with a consequent temperature rise to about 70° C.-90° C. and are not in accordance with the present invention. Stripper H was produced by the addition of the hydrogen peroxide to the sulphuric acid but without temperature control precautions so that the temperature increased to substantially above 30° C. and is therefore also not in accordance with the present invention.

Where a tin and/or sequestrant content is shown below the appropriate quantity was introduced, dissolved in the hydrogen peroxide solution the tin being in the form of stannate. Stripper J had included an appropriate quantity of oleum to react with all the water present. The oleum was mixed with the sulphuric acid before the hydrogen peroxide solution was introduced.

| Stripper A | Permonosulphuric acid | 4.6% wt |
| --- | --- | --- |
| | Water | 2.2% wt |
| | Dequest 2010 | 0.2% wt |
| | Tin | 0.2 ppm wt |
| Stripper B | Stripper A stored for 2½ months at 25° C. | |
| Stripper C | Stripper A with 5% wt water added to the bath and comprising | |
| | Permonosulphuric acid | 4.6% wt |
| | Water | 7.2% wt |
| | Dequest 2010 | 0.2% wt |
| | Tin | 0.2 ppm wt |
| Stripper D | Stripper A with 10% wt water added and comprising | |
| | Permonosulphuric acid | 4.3% wt |
| | Water | 12.2% wt |
| | Dequest 2010 | 0.2% wt |
| | Tin | 0.2 ppm wt |
| Stripper E | Permonosulphuric acid | 5.6% wt |
| | Water | 5.9% wt |
| | Dequest 2010 | 0.2% wt |
| Stripper F | Permonosulphuric acid | 7.8% wt |
| | Water | 2.4% wt |
| | Dequest 2010 | 0.2% wt |
| Stripper G | Permonosulphuric acid | 7.2% wt |
| | Water | 2.4% wt |
| Stripper H | Permonosulphuric acid | 5.7% wt |
| | Water | 5.9% wt |
| Stripper J | An anhydrous stripper comprising | |
| | Permonosulphuric acid | 4.7% wt |
| | Dequest 2010 | 0.2% wt |
| | Tin | 0.2 ppm wt |

The results of these stripping tests in terms of Resist Strip Rate and aluminum attack rate are set out in the following Table which also identifies the temperature of the stripping solution and the time of immersion.

TABLE 5

| Ex | Temp °C. | Strip time (sec) | Resist strip rate Å/sec | Aluminium attack Å/min | Total Al removal Å |
| --- | --- | --- | --- | --- | --- |
| A | 24 | 600 | 20 | 25 | 250 |
| B | 24 | 600 | 20 | 30 | 300 |
| C | 64 | 40 | 250 | 1000 | 670 |
| D | 24 | 800 | 15 | 70 | 930 |
| H | 86 | 20 | 500 | 3000 | 1000 |
| J | 24 | 600 | 20 | 25 | 250 |

Commenting now on Table 5, the final column shows the total aluminum removed by the stripper in the time it takes to remove the resist.

It will be seen stripper A is very satisfactory at room temperature and that after storage for 2½ months, (stripper B) no significant deterioration has taken place.

If a limited quantity of water is added to the stripper in the bath without temperature control (stripper C0, the most noticeable results are the exotherm and the much reduced stripping time (10 min to 40 sec). However the stripper is also comparatively more aggressive towards the aluminum. The combination of these effects means that if the wafer were left in the bath for 30 sec longer than necessary, stripper A would only remove a further 12 Angstroms of aluminium to a total of 262 Angstroms, whilst stripper C would remove a further 500 Angstroms to a total of 1170 Angstroms. Clearly minimum removal of a aluminium is desirable since it may be subjected to repeated stripping treatments in making a wafer. These tests also show that the stripping step should desirably not be followed directly by a water wash, unless precautions are taken.

The experiment with stripper D was designed to emphasise the importance of the low water content. This stripper was made of dilution of the Stripper A under suitably controlled temperature conditions. Unfortunately it was not possible also to test the stripping effect after storage as the stripper had decomposed.

Stripper E contains the same proportions of permonosulphuric acid and water as that of Example 1 of U.S. Pat. No. 3,900,337. On preparation (by adding the sulphuric acid to the peroxide) the temperature rose to 90° C. The mixture was cooled as quickly as possible and then analysed. On being sorted at 25° C., this stripper lost 24% of its permonosulphuric acid content after 14 days and 65% after 16 weeks.

Stripper F contains the same proportions of permonosulphuric acid and water as the stripper of Example 5 of U.S. Pat. No. 3,900,337. On preparation the temperature rose to 70° C. This stripper only lost 15.6% of its permonosulphuric acid content on storage for 14 days, but it was noticed that it was physically unstable in that shaking caused vigorous gas evolution. After 16 week in storage at 25° C. it had lost 71% of its permonosulphuric acid content.

Stripper G corresponds more precisely to the said prior art Example 5 in that it contains no Dequest and no tin. It lost 32% of its permonosulphate content on storage and for 14 days and 86% after 16 weeks and was physically unstable. No experiments were carried out to determine the stripping capabilities of Strippers E, F and G since they were not storage stable; it should be mentioned that Stripper A containing both Dequest and tin was stable against shaking and after 16 weeks storage at 25° C. had lost only 53% of its permonosulphuric acid content thereby demonstrating superior stability in comparison with strippers F and G.

Stripper H corresponds to the current practice in the art, the mixture being made up in the bath and at elevated temperature. Undue attack on aluminium metallisation was noted.

stripper J did not differ in performance from the Stripper A.

In all cases the strippers were made up using electronic grade chemicals, under clean-room conditions and therefore corresponded at least to the preferred features stated in Tables 3 and 4 above.

What is claimed is:

1. A photoresist stripping solution consisting essentially of sulfuric acid in a concentration of at least 75% by weight, not more than 1.43% of hydrogen peroxide, permonosulfuric acid in a concentration of at least 2% by weight and water of not more than 6% by weight, a soluble tin compound in from 0.01 to 1 part per million by weight calculated as Sn and a phosphonate sequestrant in from 0.1% to 0.4% by weight.

2. A photoresist stripping solution as claimed in claim 1 wherein the permonosulphuric acid has a concentration of at least 4% by weight.

3. A solution as claimed in claim 1 wherein the tin compound is sodium stannate.

4. A solution as claimed in claim 1 wherein the sequestrant is hydroxy ethylidene di-phosphonic acid.

5. A solution as claimed in claim 1 having contents of cobalt, chromium, copper, manganese and nickel each not above 100 parts per billion by weight and of iron not above 1000 parts and zinc not above 500 parts on the same basis.

6. A solution as claimed in claim 5 containing average numbers of particles having sizes equal to or smaller than 0.5. 1.0, 2.0, 5.0, 10.0 and 15.0 microns per 10 ml of solution not above 2000, 500, 120, 16, 4 and 1.7 respectively.

7. A photoresist stripping solution as claimed in claim 1 containing from 0.01 to 0.2 parts per million of the soluble tin compound calculated as Sn.

8. A process for stripping photoresist from a substrate which comprises; immersing the photoresist-bearing substrate in a solution of sulfuric acid, not more than 1.43% of hydrogen peroxide and permonosulfuric acid in a concentration of at least 2% by weight the solution being characterized by a content of water of not more than 5% by weight at a temperature below 50° C.

9. A process as claimed in claim 8 wherein the temperature of the solution is maintained at from 10° C. to 30° C.

10. A process as claimed in claim 8 wherein the substrate is a silicon wafer bearing a aluminium metallisation.

11. A photoresist stripping solution consisting essentially of sulphuric acid in a concentration of at least 80% by weight, hydrogen peroxide, permonosulphuric acid in a concentration of at least 4% by weight, at most 6% by weight of water, from 0.01 to 0.2 parts per million by weight of a soluble tin compound calculated as Sn, from 0.1% to 0.4% of hydroxy ethylidene diphosphonic acid, not more than 100 parts per billion by weight of any cobalt, copper, manganese and nickel, not more than 1000 parts per billion of iron and not more than 500 parts per billion of zinc, each calculated as the metal and not more than 2000 particles per 10 ml of solution having a particle size of 0.5 microns or less.

* * * * *